United States Patent
Khater et al.

(10) Patent No.: US 8,168,503 B2
(45) Date of Patent: May 1, 2012

(54) METHOD FOR FORMING AN SOI SCHOTTKY SOURCE/DRAIN DEVICE TO CONTROL ENCROACHMENT AND DELAMINATION OF SILICIDE

(75) Inventors: Marwan H. Khater, Astoria, NY (US); Christian Lavoie, Ossining, NY (US); Bin Yang, Ossining, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/726,736

(22) Filed: Mar. 18, 2010

(65) Prior Publication Data

US 2011/0230017 A1 Sep. 22, 2011

(51) Int. Cl.
*H01L 21/336* (2006.01)
(52) U.S. Cl. .................................. 438/300; 438/285
(58) Field of Classification Search .................. 438/285, 438/799, 682, 300; 285/E21.438, E21.439; 257/E21.438, E21.439, E21.415, E21.619
See application file for complete search history.

(56) References Cited

U.S. PATENT DOCUMENTS

| | | | |
|---|---|---|---|
| 6,465,313 B1 * | 10/2002 | Yu et al. | 438/300 |
| 7,221,019 B2 | 5/2007 | Snyder et al. | |
| 2006/0194399 A1 * | 8/2006 | Wen et al. | 438/305 |
| 2008/0108196 A1 * | 5/2008 | Chu | 438/285 |
| 2008/0142835 A1 | 6/2008 | Peidous et al. | |
| 2008/0283916 A1 * | 11/2008 | Yamazaki | 257/347 |
| 2009/0173973 A1 * | 7/2009 | Kimoto | 257/280 |
| 2010/0184265 A1 | 7/2010 | Maitra et al. | |

OTHER PUBLICATIONS

M. Zhang, et al., Improved carrier injection in ultrathin-body SOI Schottky-barrier MOSFETs, Purdue Libraries, 2007.
Office Action dated Jul. 8, 2011 received in a related U.S. Appl. No. 12/542,771.

* cited by examiner

*Primary Examiner* — Caridad Everhart
(74) *Attorney, Agent, or Firm* — Scully, Scott, Murphy & Presser, P.C.; Louis J. Percello, Esq.

(57) ABSTRACT

A method of fabricating a Schottky field effect transistor is provided that includes providing a substrate having at least a first semiconductor layer overlying a dielectric layer, wherein the first semiconductor layer has a thickness of less than 10.0 nm. A gate structure is formed directly on the first semiconductor layer. A raised semiconductor material is selectively formed on the first semiconductor layer adjacent to the gate structure. The raised semiconductor material is converted into Schottky source and drain regions composed of a metal semiconductor alloy. A non-reacted semiconductor material is present between the Schottky source and drain regions and the dielectric layer.

19 Claims, 1 Drawing Sheet

METHOD FOR FORMING AN SOI SCHOTTKY SOURCE/DRAIN DEVICE TO CONTROL ENCROACHMENT AND DELAMINATION OF SILICIDE

CROSS-REFERENCE TO RELATED APPLICATION

The present invention is related to the following commonly-owned, co-pending United States Patent Application filed on even date herewith, the entire content and disclosure of which is expressly incorporated by reference herein as if fully set forth herein. U.S. patent application Ser. No. 12/726,789 (YOR920090602US1 (24771)), for "An SOI Schottky Source/Drain Device Structure to Control Encroachment and Delamination of Silicide".

BACKGROUND

The present disclosure relates generally to field effect transistors. More particularly, the present disclosure relates to scaling of field effect transistors.

Scaling achieves compactness and improves operating performance in devices by shrinking the overall dimensions and operating voltages of the device while maintaining the device's electrical properties. As channel lengths are reduced, drive currents increase, which is beneficial for circuit performance. However, leakage currents increase as well. Transistor leakage currents are traditionally controlled by introducing controlled amounts of impurities (dopants) into the channel region of the device, and by tailoring the source/drain lateral and vertical doping distributions. Although these approaches are effective in shoring up the potential barrier internal to the metal oxide semiconductor (MOS) transistor and therefore reducing the leakage current, they can also contribute to degraded drive current and increased parasitic capacitance. Given traditional MOS transistor design and architecture, there are only limited solutions to the trade-off between drive current, leakage current, parasitic capacitance and resistance, and manufacturing complexity/cost.

SUMMARY

A method of fabricating a Schottky field effect transistor is provided in which the channel of the device is present in an extremely thin semiconductor on insulator (ETSOI) layer, i.e., a semiconductor containing layer having a thickness of less than 10.0 nm, and the source and drain regions are formed on a raised semiconductor layer, e.g., silicon. In one embodiment, the method may begin with providing a substrate comprising at least a first semiconductor layer overlying a dielectric layer, wherein the first semiconductor layer has a thickness of less than 10.0 nm. A gate structure is formed directly on the first semiconductor layer. A raised semiconductor material is formed on the first semiconductor layer adjacent to the gate structure. The raised semiconductor material is converted into Schottky source and drain regions composed of a metal alloy semiconductor. A non-reacted semiconductor material is present between the Schottky source and drain regions and the dielectric layer.

In another embodiment, a method of fabricating a Schottky field effect transistor is provided that includes providing a substrate including at least a first semiconductor layer overlying a dielectric layer, wherein the first semiconductor layer has a thickness of less than 10.0 nm. A gate structure is directly formed on the first semiconductor layer. A raised semiconductor material is formed on the first semiconductor layer adjacent to the gate structure. The raised semiconductor material is converted into Schottky source and drain regions composed of a metal semiconductor alloy. A first portion of the Schottky source and drain regions that is adjacent to a channel region of the Schottky field effect transistor contacts the dielectric layer, and a non-reacted semiconductor material is present between a second portion of the Schottky source and drain regions and the dielectric layer.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
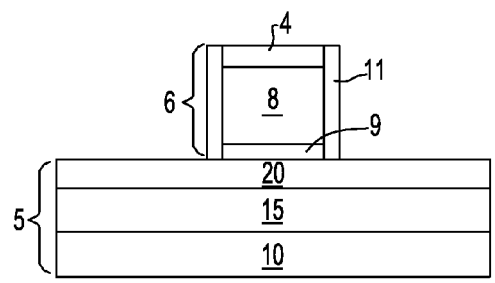
FIG. 1 is a side cross-sectional view depicting forming a gate structure on a substrate comprising at least a first semiconductor layer atop a dielectric layer, wherein the first semiconductor layer has a thickness of less than 10 nm, as used in one embodiment of a method for forming a Schottky field effect transistor.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention. References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one embodiment, a method is provided for forming a Schottky field effect transistor on a semiconductor on insulator (SOI) substrate having an extremely thin semiconductor on insulator (ETSOI) layer. An extremely thin semiconductor on insulator (ETSOI) layer is the semiconductor layer that is present atop a buried insulating layer of an SOI substrate, wherein the ETSOI layer has a thickness of 10 nm or less. Schottky devices formed on ETSOI substrates typically suffer from silicide delamination in the source and drain regions. More specifically, in a 10 nm thick ETSOI layer the thickness of the layer following cleaning processes is typically on the order of 5 nm. To reduce sheet resistance, in prior Schottky devices the ETSOI layer for the source and drain regions is fully silicided. Unfortunately, a full silicidation of the source and drain areas that is present in an ETSOI layer with a thickness of 10 nm or less typically results in delamination of the silicide and/or encroachment of the silicide beneath the gate structure. Full silicidation means that the semiconductor material, e.g., silicon, of the ETSOI layer is alloyed across it's entire depth with a metal for the entire width of the source and drain regions. In some instances, the delamination of the silicide formed from the ETSOI layer occurs because the interface between the fully silicided ETSOI layer and the underlying buried insulating layer is particularly weak when compared to the original strength of the interface between the buried insulating layer and the ETSOI layer of semiconductor material prior to silicidation. Further, in view of the weak interface strength between the fully silicided ETSOI layer and the buried insulating layer, the intrinsic stress that is created in the silicide during cooling from its' high formation temperature is sufficient to force delamination of the fully silicided ETSOI layer when the silicide layer is butted against the buried insulating layer, e.g., oxide.

Conventional processing also suffers from encroachment of the silicided ETSOI layer into the channel region of the device. The encroachment results from the difficulty in adjusting the metal thickness to the exact amount necessary to completely silicide the source and drain areas. Since the width of the source and drain regions is substantially larger than the width of the channel region, a slight over deposition of metal or a slight variation in Si thickness can lead to large excess of metal, as far as the narrow channel region is concerned.

In one embodiment, the present disclosure overcomes the disadvantages of prior Schottky field effect transistors formed on ETSOI layers by forming the metal alloy semiconductor Schottky source and drain regions on raised semiconductor material that is atop the ETSOI layer. In this embodiment, the presence of the extra semiconductor material provides that a remaining portion, i.e., non-reacted portion, of semiconductor material of the ETSOI layer is present between the alloyed portion, i.e., metal semiconductor alloy portion, of the ETSOI layer and the underlying dielectric layer, e.g., buried insulating layer. In some embodiments, the metal semiconductor alloy may contact the underlying dielectric layer, e.g., buried insulating layer, only in the portion of the substrate that is adjacent to the channel region of the device. In these embodiment, since the metal semiconductor alloy, e.g., silicide reaction, only reaches the ETSOI layer/dielectric interface close to the channel region, in most points of the source and drain regions the metal semiconductor alloy is in direct contact with an underlying semiconductor material, e.g., silicon, and adhesion to the dielectric layer, e.g., buried insulating layer, remains strong. Further, the excess semiconductor material that is provided by the raised semiconductor material positioned on the ETSOI layer reduces the likelihood that the reaction to provide the metal semiconductor alloy cannot overall be in excess of metal. By eliminating the excess of metal the possibility of the metal semiconductor alloy encroaching within the channel region of the device is eliminated. When describing the following structures and methods, the following terms have the following meanings, unless otherwise indicated.

As used herein, a "field effect transistor" is a transistor in which output current, i.e., source-drain current, is controlled by the voltage applied to the gate.

The term "Schottky" describes a field effect transistor, in which the source and drain regions of the device are provided by metal-containing regions, e.g., metal semiconductor alloy regions, such as silicide regions, as opposed to p-type and n-type dopant regions. The metal-containing regions produce Schottky barriers that exist along the interface of the metal-containing regions and the semiconductor substrate. Schottky field effect transistors do not include intentional doping of the semiconductor close to the channel region, such as deep source and drain dopant regions, halo/pocket dopant regions, and source and drain extension dopant regions.

A "Schottky barrier" is a potential barrier formed at a metal-semiconductor junction which has rectifying characteristics.

"Selective" as used in combination with the terms formation, growth and/or deposition means that a semiconductor material is formed onto another semiconductor material without being formed on the surrounding insulating areas. The selectively deposited semiconductor may be amorphous, poly-crystalline or single crystal material that is oriented or not orientated with the underlying substrate.

"Epitaxial growth and/or deposition" means the growth of a semiconductor material on a deposition surface of a semiconductor material, in which the semiconductor material being grown has the same crystalline characteristics as the semiconductor material of the deposition surface.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1-4 depict one embodiment of a method of fabricating a Schottky field effect transistor 100 that includes forming raised semiconductor material 21 on the first semiconductor layer 20 adjacent to a gate structure 6 and converting the raised semiconductor material 21 into Schottky source regions 26 and Schottky drain regions 27, which are composed of a metal semiconductor alloy.

FIG. 1 illustrates the results of the initial processing steps that produce a substrate 5, i.e., semiconductor on insulator (SOI) substrate, in which a substrate 5 comprises at least a first semiconductor layer 20 (hereafter referred to as an ETSOI layer 20) overlying a dielectric layer 15, wherein the ETSOI layer 20 has a thickness of less than 10 nm. A second semiconductor layer 10 may be present underlying the dielectric layer 15.

The ETSOI layer 20 may comprise any semiconducting material including, but not limited to Si, strained Si, SiC, SiGe, SiGeC, Si alloys, Ge, Ge alloys, GaAs, InAs, and InP, or any combination thereof. The ETSOI layer 20 may be thinned to a desired thickness by planarization, grinding, wet etch, dry etch, oxidation followed by oxide etch, or any combination thereof. One method of thinning the ETSOI layer 20 is to oxidize the Si by a thermal dry or wet oxidation process, and then wet etch the oxide layer using a hydrofluoric (HF) acid mixture. This process can be repeated to achieve the desired thickness. In one embodiment, the ETSOI layer 20 has a thickness ranging from 1.0 nm to 10.0 nm. In another embodiment, the ETSOI layer 20 has a thickness ranging from 1.0 nm to 5.0 nm. In a further embodiment, the ETSOI layer 20 has a thickness ranging from 3.0 nm to 8.0 nm.

The ETSOI layer 20 may be doped with n-type or p-type dopants. The term "p-type" dopant refers to the addition of impurities to an intrinsic semiconductor that create deficiencies of valence electrons, such as boron, aluminum, gallium or indium to an intrinsic semiconductor surface comprised of silicon. The term "n-type" dopant refers to the addition of impurities that contribute free electrons to an intrinsic semiconductor, such as antimony, arsenic or phosphorous to a semiconducting surface comprised of silicon.

The second semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors. In one embodiment, the second semiconductor layer 10 has a thickness ranging from 10.0 nm to 100.0 nm. In another embodiment, the second semiconductor layer 10 has a thickness ranging from 10.0 nm to 25.0 nm.

The dielectric layer 15 present underlying the ETSOI layer 20 and atop the second semiconductor layer 10 may be formed by implanting a high-energy dopant into the substrate 5 and then annealing the structure to form a buried insulating layer, i.e., dielectric layer 15. In another embodiment, the dielectric layer 15 may be deposited or grown prior to the formation of the ETSOI layer 20. In yet another embodiment, the substrate 5 may be formed using wafer-bonding techniques, where a bonded wafer pair is formed utilizing a glue, an adhesive polymer, or direct bonding.

The substrate 5 may also include isolation regions (not shown), such as shallow trench isolation (STI) regions. The STI regions are formed by etching a trench in the substrate 5 utilizing a dry etching process, such as reactive-ion etching (RIE) or plasma etching. The trenches may optionally be lined with a liner material, e.g., an oxide, and then chemical vapor deposition (CVD) or another like deposition process is used to fill the trench with oxide, nitride, polysilicon or another like STI dielectric material. The STI dielectric may optionally be densified after deposition. A planarization process, such as chemical-mechanical polishing (CMP), may be used to provide a planar structure.

In some examples, prior to the formation of a gate structure, the upper surface of the substrate 5 is treated with a cleaning process. In one example, the upper surface of the substrate 5 is treated with an RCA cleaning procedure. The RCA cleaning procedure has three major steps used sequentially. In a first step of the sequence, insoluble organic contaminates are removed by an organic clean that is composed of a 5:1:1 $H_2O:H_2O_2:NH_4OH$ solution. In a second step of the sequence, an oxide strip removes a thin silicon dioxide layer, in which metallic contaminants may accumulated as a result of organic clean. In one embodiment, the oxide strip is composed of a diluted 50:1 $H_2O:HF$ solution. The third step of the RCA cleaning procedure may include an ionic clean. In one embodiment, the ionic clean removes ionic and heavy metal atomic contaminants using a solution of 6:1:1 $H_2O:H_2O_2$:HCl. In some embodiments, the aforementioned clean process may further reduce the thickness of the ETSOI layer 20. For example, an ETSOI layer 20 that has a thickness of 10 nm may be reduced to a thickness of 5 nm by the RCA cleaning procedure. In one embodiment, following the RCA cleaning process, the ETSOI layer 20 has a thickness ranging from 2.5 nm to 5 nm.

FIG. 1 also depicts a gate structure 6 located directly on the ETSOI layer 20, in accordance with one embodiment of the present method. The term "gate structure" as used herein means a structure used to control output current (i.e., flow of carriers in the channel, e.g., turn "on" or "off") of the Schottky field effect transistor 100 through electrical or magnetic fields. The gate structure 6 may include at least a gate conductor 8 atop a gate dielectric 9.

The gate structure 6 can be formed using deposition, photolithography and a selective etching process. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (hereafter referred to as a dielectric cap 4) may be used to form the gate structure 6. The dielectric cap 4 may be formed by first depositing a dielectric hard mask material, like SiN or $SiO_2$, atop a layer of gate conductor material and then applying a photoresist pattern to the hard mask material. The photoresist pattern is then transferred into the hard mask material using a dry etch process forming the dielectric cap 4. Next, the photoresist pattern is removed and the dielectric cap 4 pattern is then transferred into the gate conductor material during a selective etching process. Alternatively, the gate structure 6 can be formed by other patterning techniques, such as spacer image transfer. In yet another embodiment, a replacement gate process can be used in forming the gate structure 5.

The gate conductor 8 may be composed of any conductive material including but not limited to: polysilicon; a conductive elemental metal such as W, Cu, Pt, Ag, Al, Au, Ru, Ir, Rh, Ti, Ta and Re; alloys that include at least one of the aforementioned conductive elemental metals; silicides or nitrides that include at least one of the above-mentioned conductive elemental metals; and combinations thereof. When a combination of conductive elements is employed in the gate conductor 8, an optional diffusion barrier material such as TaN or WN may be formed between the conductive materials. The gate conductor may also be composed of low resistivity intermetallics. In one embodiment, the gate conductor 8 may be a doped semiconductor material, such as a doped silicon-containing material, e.g., doped polysilicon. In some examples, the gate conductor 8 is doped with an n-type or p-type dopant.

The gate conductor 8 of the gate structure 6 is typically present on a gate dielectric 9. The gate dielectric 9 may be a dielectric material, such as $SiO_2$, or alternatively high-k dielectrics, such as oxides of Hf, Ta, Zr, Al or combinations thereof. High-k dielectrics have a dielectric constant greater than the dielectric constant of $SiO_2$, e.g., greater than 4.0. In another embodiment, the gate dielectric 9 is comprised of an oxide, such as $HfO_2$, $SiO_2$, $ZrO_2$, $Ta_2O_5$ or $Al_2O_3$. In one embodiment, the gate dielectric 9 has a thickness ranging from 1 nm to 10 nm. In another embodiment, the gate dielectric 9 has a thickness ranging from 1.5 nm to 2.5 nm.

Sidewall spacers 11 can be formed in direct contact with the sidewalls of the gate structure 6. The sidewall spacers 11 are typically narrow having a width ranging from 2.0 nm to 15.0 nm. The sidewall spacer 11 can be formed using deposition and etch processing steps. The sidewall spacer 11 may be composed of a dielectric, such as nitride, oxide, oxynitride, or a combination thereof. The thickness of the sidewall spacer 11 determines the proximity of the subsequently formed Schottky source and drain regions to the channel of the device. As used herein, the term "channel region" is the region underlying the gate structure 6 and between the Schottky source and drain regions of a Schottky field effect transistor that becomes conductive when the transistor is turned on.

Figure 2:
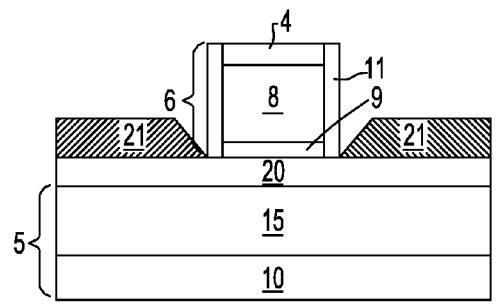
FIG. 2 is a side cross-sectional view depicting selective formation of the raised semiconductor material on the first semiconductor layer adjacent to the gate structure, in accordance with one embodiment of the present method.

FIG. 2 depicts one embodiment of selectively forming a raised semiconductor material 21 on the ETSOI layer 20 adjacent to the gate structure 6. The term "raised" as used to describe the raised semiconductor material 21 means that the added semiconductor material has an upper surface that is vertically offset and above the upper surface of the ETSOI layer 20 which is in the channel region 22 of the device. In one embodiment, the raised semiconductor material 21 is epitaxially formed material, and has a thickness ranging from 5 nm to 80 nm, as measured from the upper surface of the ETSOI layer 20. In another embodiment, the raised semiconductor material 21 has a thickness ranging from 10 nm to 50 nm, as measured from the upper surface of the ETSOI layer 20. In yet another embodiment, the raised semiconductor material 21 has a thickness ranging from 10 nm to 20 nm, as measured from the upper surface of the ETSOI layer 20. In one embodiment, the thickness of the raised semiconductor material 21 is substantially equal to the thickness of the ETSOI layer 20.

In one embodiment, the raised semiconductor material 21 is selectively formed in direct contact with the ETSOI layer 20. The raised semiconductor material 21 can be formed using an epitaxial growth process. When the chemical reactants are controlled and the system parameters set correctly, the depositing atoms arrive at the surface of the ETSOI layer 20 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. In some embodiments, the selective deposition of the raised semiconductor material 21 results in an amorphous structure.

The raised semiconductor material 21 may be provided by selective growth of silicon. The silicon may be single crystal, polycrystalline or amorphous. The raised semiconductor material may be epitaxial silicon. The raised semiconductor material 21 may also be provided by selective growth of germanium. The germanium may be single crystal, polycrystalline or amorphous. In another example, the raised semiconductor material 21 may be composed of SiGe. Germanium or silicon may also be introduced to the raised semiconductor material 21 by ion implantation. In one example, the raised semiconductor material 21 is provided by a blanket selective deposition of germanium followed by a thermal budget to intermix the germanium with an underlying silicon layer.

A number of different sources may be used for the selective deposition of silicon. Silicon sources for growth of silicon (epitaxial or poly-crystalline) include silicon tetrachloride, dichlorosilane ($SiH_2Cl_2$), and silane ($SiH_4$). The temperature for epitaxial silicon deposition typically ranges from 550° C. to 900° C. Higher temperature typically results in faster deposition, the faster deposition may result in crystal defects and film cracking. In some embodiments of the method disclosed herein, since the selectively deposited semiconductor material, i.e., raised semiconductor material 21, is consumed by the reaction that provides the metal semiconductor alloy, the crystalline quality of the grown layer is not critical.

In one embodiment, the raised semiconductor material 21 may be provided by selective-epitaxial growth of SiGe atop the ETSOI layer 20. The Ge content of the grown SiGe may range from 5% to 60%, by atomic weight %. In another embodiment, the Ge content of the grown SiGe may range from 10% to 40%. In one embodiment, the SiGe may be epitaxial and under an intrinsic compressive strain, in which the compressive strain is produced by a lattice mismatch between the larger lattice dimension of the SiGe and the smaller lattice dimension of the layer on which the SiGe is epitaxially grown.

In another embodiment, the raised semiconductor material 21 is composed of selectively grown Si:C, i.e., carbon doped silicon. The carbon (C) content of the grown Si:C ranges from 0.1% to 10%, by atomic weight %. In another embodiment, the carbon (C) content of the grown Si:C may range from 1% to 2%. In one embodiment, the grown Si:C is epitaxial and may be under an intrinsic tensile strain, in which the tensile strain is produced by a lattice mismatch between the smaller lattice dimension of the Si:C and the larger lattice dimension of the layer on which the Si:C is epitaxially grown.

In one embodiment, the raised semiconductor material 21 has a tapered portion that extends from the sidewall spacer 11. More specifically, in this embodiment, the thickness of the tapered portion of the raised semiconductor material 21 increases in the lateral direction away from the sidewall spacer 11. Following the taper portion, the upper surface of the raised semiconductor material 21 is substantially parallel to the upper surface of the ETSOI layer 20.

Figure 3:
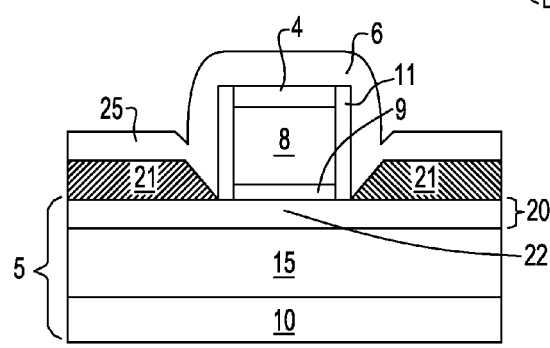
FIG. 3 is a side cross-sectional view depicting depositing a metal-containing layer on the raised semiconductor material, in accordance with one embodiment of the present method.

FIG. 3 depicts one embodiment of depositing a metal-containing layer 25 on the raised semiconductor material 21. In one embodiment, the metal-containing layer 25 is blanket deposited overlying the entire structure depicted in FIG. 2. More specifically, the metal containing layer 25 is deposited on the upper surface of the raised semiconductor layer 21 and the gate structure 6 including the sidewall spacers 11 and the dielectric cap 4. In one embodiment, the metal containing layer 25 is deposited in direct contact with the raised semiconductor material 21.

The composition of the metal-containing layer 25 is selected to alloy with the raised semiconductor material 21 to provide Schottky source regions 26 and Schottky drain regions 27 composed of a metal semiconductor alloy. The metal-containing layer 25 is composed of a metal that is suitable for forming a Schottky barrier with the substrate material 5. In one embodiment, the composition of the metal-containing layer 25 is selected to provide a suitable work function for the band gap of the intrinsic semiconductor material of the substrate 5 to provide the rectifying properties of a Schottky barrier. In another embodiment, the composition can be selected for a mid gap material, in which doped impurities produce the appropriate contact resistance at the interface of the metal semiconductor alloy of the Schottky source and drain regions 26, 27 and the channel portion of the ETSOI layer 20 that is composed of a semiconductor, such as silicon. In determining suitable materials for the metal-containing layer 25 the carrier type that is responsible for the conduction, e.g., n-type or p-type conductivity, of the ETSOI layer 20 is also considered. Examples of metals suitable for the metal-containing layer 25 include but are not limited to Ni, Co, Ti, and Rare Earth elements. For n-type devices metals suitable for forming the Schottky source and drain regions 26, 27 include, but are not limited to Sc, Er, Y, Yb, Dy and combinations thereof. For p-type devices metals suitable for forming the Schottky source and drain regions 26, 27 include, but are not limited to Pt, Ir or a combination thereof. Other examples of metals suitable for the metal-containing layer 25 include tungsten, copper, nickel, manganese, zirconium, vanadium, chromium, tantalum, molybdenum. In one example, the metal-containing layer 25 for both the source and drain regions is composed of nickel and the ETSOI layer 20 is composed of silicon in order to produce a metal alloy having a nickel silicide composition. The nickel silicide may be engineered through doping to provide the appropriate characteristics for n-type and p-type devices.

The metal-containing layer 25 may be deposited by a physical vapor deposition (PVD) method, such as sputtering. As used herein, "sputtering" means a method of depositing a film of metallic material, in which a target of the desired material, i.e., source, is bombarded with particles, e.g., ions, which knock atoms from the target, and the dislodged target material deposits on the deposition surface. Examples of sputtering apparatus that may be suitable for depositing the metal-containing layer 25 include DC diode type systems, radio frequency (RF) sputtering, magnetron sputtering, and ionized metal plasma (IMP) sputtering. In another example, the metal-containing layer 25 may be deposited using chemical vapor deposition (CVD). Chemical vapor deposition (CVD) is a deposition process in which a deposited species is formed as a results of chemical reaction between gaseous reactants at an elevated temperature typically being greater than 300° C., wherein solid product of the reaction is deposited on the surface on which a film, coating, or layer of the solid product is to be formed. Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others.

In one embodiment, the metal-containing layer 25 is deposited by a conformal deposition method. The term "conformal" denotes a layer having a thickness that does not deviate from greater than or less than 20% of an average value for the thickness of the layer.

In one embodiment, the thickness of the metal-containing layer 25 ranges from 1 nm to 100 nm. In another embodiment, the thickness of the metal-containing layer 25 ranges from 1 nm to 20 nm. In yet another embodiment, the thickness of the metal-containing layer 25 ranges from 1 nm to 10 nm.

Figure 4:
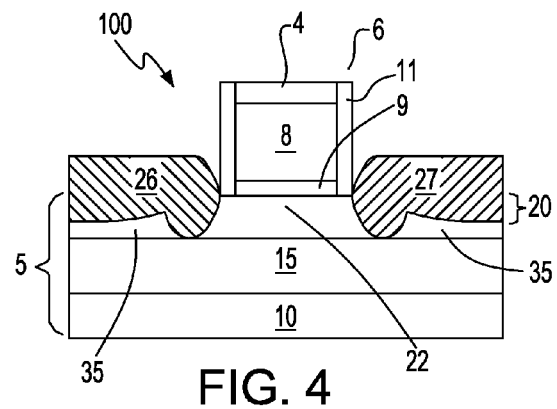
FIG. 4 is a side cross-sectional view depicting converting the raised semiconductor material and the metal containing layer into Schottky source and drain regions comprised of a metal semiconductor alloy, in accordance with one embodiment of the present method.

FIG. 4 depicts converting the raised semiconductor material 21 and the metal containing layer 25 into Schottky source regions 26 and Schottky drain regions 27 comprised of a metal semiconductor alloy. In some embodiments, the metal semiconductor alloys reaches the buried oxide only near the channel of the device, which may be referred to as the first portion of the Schottky source and drain regions 26, 27. In the second portion of the Schottky source and drain areas 26, 27 that are separated from the channel, the semiconductor material of the ETSOI layer 20 is not completely consumed. A "metal semiconductor alloy" is an alloy of a metal and semiconductor. In one embodiment, the metal semiconductor alloy is a silicide. A "silicide" is an alloy of a metal and silicon. Examples of silicides suitable for the Schottky source regions 26 and Schottky drain regions 27, include silicides having any of the aforementioned metals of the metal-containing material layer 25, including, but not limited to: nickel silicide ($NiSi_x$), erbium silicide, nickel platinum silicide ($NiPt_ySi_x$), platinum silicide (PtSi), cobalt silicide ($CoSi_x$), tantalum silicide ($TaSi_x$), titanium silicide ($TiSi_x$) and combinations thereof. In one embodiment, the Schottky source region 26 and the Schottky drain region 27 are both comprised of NiPtSi or NiSi for both n-type and p-type device, in which the Schottky source region 26 and the Schottky drain region 27 are doped to provide the appropriate contact resistance at the interface of the metal semiconductor alloy and the channel portion of the ETSOI layer 20 that is composed of a semiconductor, such as silicon.

In one embodiment, the conversion of raised semiconductor material 21 and metal-containing layer 25 into the Schottky source and drain regions 26, 27 composed of the metal semiconductor alloy is provided by a thermal treatment. During the thermal treatment the raised semiconductor material 21 and the metal-containing layer 25 inter-diffuse to provide a metal semiconductor alloy. In one embodiment, the thermal treatment method may include an annealing process including, but not limited to: rapid thermal annealing, furnace annealing, flash lamp annealing, laser annealing, or combinations thereof. In one embodiment, thermal annealing to inter-diffuse the raised semiconductor material 21 and the metal-containing layer 25 is conducted at a temperature ranging from 250° C. to 800° C. In another embodiment, the thermal annealing ranges from 350° C. to 500° C.

Following alloying of the metal-containing layer 25 and the raised semiconductor material 21, the non-reacted portions of the metal-containing layer 25 may be removed. Typically, the formation of metal alloys, such as silicides, requires that a metal material and a semiconductor material be in direct contact during the thermal treatment that inter-diffuses the metal and the semiconductor. The portions of the metal-containing layer 25 that are not present on a semiconductor-containing layer do not form a metal semiconductor alloy. For example, the portions of the metal-containing layer 25 that are present on the sidewall spacer 11 and the dielectric cap 4 of the gate structure 6 do not react with a semiconductor-containing material during the formation of the Schottky source region 26 and the Schottky drain region 27. In one embodiment, the non-reacted portions of the metal-containing layer 25 are removed by a selective etch process. As used herein, the term "selective" in reference to a material removal process denotes that the rate of material removal for a first material is greater than the rate of removal for at least another material of the structure to which the material removal process is being applied. More specifically, in one example, the non-reacted portion of the metal-containing layer 25 is removed selective to the Schottky source region 26 and the Schottky drain region 27, as well as the gate structure 6.

The Schottky source regions 26 and the Schottky drain regions 27 typically have a thickness ranging from 5 nm to 20 nm. In another embodiment, the Schottky source region 26 and the Schottky drain regions 27 each have a thickness ranging from 10 nm to 15 nm. The Schottky source regions 26 and the Schottky drain regions 27 have a depth that does not extend through the entire depth of the ETSOI layer 20. Therefore, underlying the Schottky source regions 26 and Schottky drain regions 27 is a portion of non-reacted semiconductor material 35 from the ETSOI layer 20. The term "non-reacted semiconductor material" means a semiconductor material that does not include a metal element present therein. For example, in one embodiment, the metal content of the non-reacted semiconductor material 35 is less than 5%. In an even further embodiment, the metal content of the non-reacted semiconductor material 35 is less than 1.0%.

In one embodiment, the non-reacted portion of the ETSOI layer 20, i.e., non-reacted semiconductor material 35, that is underlying the Schottky source regions 26 and the Schottky drain regions 27 is present in the lower ½ of the original thickness of the ETSOI layer 20. For example, when the ETOSI layer 20 has an original thickness of 10 nm, the thickness of the non-reacted semiconductor material 35 of the ETSOI layer 20 is 5 nm, as measured from the upper surface of the dielectric layer 15. In another example, the thickness of the non-reacted semiconductor material 35 of the ETSOI layer ranges from 1.0 nm to 5.0 nm. Typically, the thickness of the non-reacted semiconductor material 35 of the ETSOI layer ranges from 10% to 50% of the original thickness of the ETSOI layer.

In another embodiment, the Schottky source regions 26 and Schottky drain regions 27 include a portion that extends through the entire thickness of the ETSOI layer 20. The portion, i.e., first portion, of the Schottky source and drain regions 26, 27 that extend through the entire thickness of the ETSOI layer 20 corresponds with the tapered portion of the raised semiconductor material 21 that is adjacent to the sidewall spacer 11 of the gate structure 6. In the embodiments including the tapered portion of the raised semiconductor layer 21, the portion of the Schottky source and drain regions 26, 27 that is formed from the tapered portion of the raised epitaxial semiconductor material 21 extends to the dielectric layer 15, because the tapered portion provides less semiconductor material for alloying with the metal-containing layer 25. A second portion of the Schottky source and drain regions 26, 27 is separated from the dielectric layer 15 by a remaining portion of non-reacted semiconductor material 35 from the ETSOI layer 20, in which the second portion of the Schottky source and drain regions 26, 27 extends from the portion of the Schottky source and drain regions 26, 27 that is formed with the tapered portion of the raised semiconductor material 21.

The channel region 22 is present between the Schottky source regions 26 and the Schottky drain regions 27 and has a thickness that is determined by the thickness of the ETSOI layer 20. In one example, the thickness of the channel region 22 is typically less than 10.0 nm. In another example, the thickness of the channel region 22 ranges from 2 nm to 5 nm.

The Schottky source regions 26 and Schottky drain regions 27 formed by the above-described method are resistant to delamination from the dielectric layer 15 and do not encroach under the gate structure 6. In one example, the end of the Schottky source regions and Schottky drain regions 27 is aligned with the sidewall of the gate structure 6. In prior Schottky devices that do not employ the raised epitaxial semiconductor material in forming the Schottky source regions 26 and Schottky drain regions 27, the silicide delaminates from the buried dielectric layer because silicide films on insulating materials have poor adhesion properties. For example, a nickel platinum silicide can produce a tensile stress in the range of 400 MPa to about 1 GPa depending on the concentration of the platinum contained therein. Because the thermal expansion of silicide thin films are typically 4× to 5× greater than thermal expansion of a silicon-containing substrate, cooling from the temperature of formation generate the tensile stress within the silicide layer. When a nickel platinum silicide is present on a buried insulating layer, the tensile stressed silicide may be delaminated from the buried insulating layer by selective etch processes that are performed during the manufacturing of the device.

The methods and structures of the present disclosure substantially eliminate delamination by providing a non-reacted semiconductor material 35 between the dielectric layer 15 and the Schottky source regions 26 and Schottky drain regions 27. The non-reacted semiconductor material 35 that is present between the dielectric layer 15 and the Schottky source and drain regions 26, 27 provides increased adhesion of the metal semiconductor alloy than similar structures in which the non-reacted semiconductor material 35 is not present. Further, the increased content of semiconductor material that is provided by the raised epitaxial semiconductor material 21 substantially reduces the possibility that an excess of metal for the available semiconductor material for alloying does not result in encroachment of the Schottky source regions 26 and Schottky drain regions 27 beneath the gate structure. Ensuring that an excess of semiconductor material remains after the reaction with the metal-containing layer 25 to provide the metal semiconductor alloy of the Schottky source regions 26 and Schottky drain regions 27 controls encroachment of the metal semiconductor alloy, because no excess of metal is present so that the metal semiconductor alloy can not extend underneath the gate structure 6. In one embodiment, the Schottky source regions 26 and the Schottky drain regions 27 are not located beneath the gate dielectric 9 of the gate structure 6, yet are abutting the portion of the portion of the ETSOI layer 20 that is underlying the gate structure 6 (also referred to as the channel region 22).

Still referring to FIG. 4, a Schottky field effect transistor 100 is provided including a substrate 5 having a layer of semiconductor material 20 (also referred to as ETSOI layer 20) atop an insulating layer 15 (also referred to as dielectric layer 15), wherein the layer of semiconductor material has a thickness of less than 10.0 nm. A gate structure 6 is present on the layer of the semiconductor material 20, and raised metal semiconductor alloy source and drain regions 26, 27 (also referred to as Schottky source and drain region 26, 27) are present on the layer of semiconductor material 20 on opposing sides of the gate structure 6.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a Schottky field effect transistor comprising:
    providing a substrate including at least a first semiconductor layer overlying a dielectric layer, wherein the first semiconductor layer has a thickness of less than 10.0 nm;
    forming a gate structure directly on the first semiconductor layer;
    forming a raised semiconductor material on the first semiconductor layer adjacent to the gate structure; and
    converting the raised semiconductor material into Schottky source and drain regions comprised of a metal semiconductor alloy, and wherein a non-reacted semiconductor material having a thickness of less than 5.0 nm is present between the Schottky source and drain regions and the dielectric layer, wherein the non-reacted semiconductor material reduces delamination of the raised semiconductor material in comparison to a raised semiconductor material fully reacted to the metal semiconductor alloy so that the metal semiconductor alloy is in direct contact with the dielectric layer.

2. The method of claim 1, wherein providing the substrate further comprises forming the dielectric layer on a second semiconductor layer, wherein the first semiconductor layer is formed on the dielectric layer.

3. The method of claim 1, wherein the first semiconductor layer has a thickness ranging from 1.0 nm to 5.0 nm.

4. The method of claim 1, wherein forming the gate structure comprises:
    depositing a gate dielectric atop the substrate;
    depositing a gate conductor atop said gate dielectric;
    forming an etch mask atop the gate conductor;

etching the gate conductor and said gate dielectric selective to the etch mask to form a gate stack; and forming a spacer on sidewalls of the gate stack.

5. The method of claim 1, wherein the forming of the raised semiconductor material comprises epitaxial growth of Si.

6. The method of claim 1, wherein the forming of the raised semiconductor material comprises epitaxial growth of SiGe or Si:C.

7. The method of claim 1, wherein the Schottky source and drain regions are comprised of nickel silicide ($NiSi_x$) nickel platinum silicide ($NiPt_ySi_x$) or a combination thereof.

8. The method of claim 1, wherein the Schottky source and drain regions do not encroach to be underneath the gate structure.

9. The method of claim 1, wherein the forming of the raised semiconductor material comprises a selective deposition process.

10. The method of claim 9, wherein the selective deposition process comprises epitaxial growth.

11. The method of claim 1, wherein the converting of the raised semiconductor material into the Schottky source and drain regions comprises:
  depositing a metal-containing layer on the raised semiconductor material;
  annealing to alloy the metal-containing layer and the raised semiconductor material; and
  removing a non-reacted portion of the metal containing layer.

12. The method of claim 11, wherein the annealing to alloy the metal-containing layer and the raised epitaxial semiconductor material comprises rapid thermal annealing (RTA), flash anneal or laser annealing.

13. The method of claim 11, wherein the removing of the non-reacted portion of the metal containing layer comprises a selective etch process.

14. A method of fabricating a Schottky field effect transistor comprising:
  providing a substrate including at least a first semiconductor layer overlying a dielectric layer, wherein the first semiconductor layer has a thickness of less than 10.0 nm;
  forming a gate structure directly on the first semiconductor layer;
  forming a raised semiconductor material on the first semiconductor layer adjacent to the gate structure; and
  converting the raised semiconductor material into Schottky source and drain regions comprised of a metal semiconductor alloy, wherein a first portion of the Schottky source and drain regions contacts the dielectric layer adjacent to a channel region of the Schottky field effect transistor, and a non-reacted semiconductor material is present between a second portion of the Schottky source and drain regions and the dielectric layer.

15. The method of claim 14, wherein the second portion of the Schottky source and drain region is greater in width than the first portion of the Schottky source and drain region.

16. The method of claim 14, wherein the forming of the raised semiconductor material comprises a selective deposition process.

17. The method of claim 14, wherein the selective deposition process comprises epitaxial growth.

18. The method of claim 14, wherein the converting of the raised semiconductor material into the Schottky source and drain regions comprises:
  depositing a metal-containing layer on the raised semiconductor material;
  annealing to alloy the metal-containing layer and the raised semiconductor material; and
  removing a non-reacted portion of the metal containing layer.

19. The method of claim 14, wherein the Schottky source and drain regions do not encroach to be underneath the gate structure.

* * * * *